United States Patent [19]

Wang et al.

[11] 4,040,922
[45] Aug. 9, 1977

[54] PHOTOPOLYMERIZABLE POLYMERIC COMPOSITIONS CONTAINING HALOGEN-CONTAINING HETEROCYCLIC COMPOUND

[75] Inventors: Richard H. S. Wang; Gordon C. Newland; James G. Pacifici, all of Kingsport, Tenn.

[73] Assignee: Eastman Kodak Company, Rochester, N.Y.

[21] Appl. No.: 620,100

[22] Filed: Oct. 6, 1975

[51] Int. Cl.$^2$ .......................... C08F 2/46; C08F 4/00
[52] U.S. Cl. .............................. 204/159.15; 96/115 R; 96/115 P; 204/159.16; 204/159.18; 204/159.19; 204/159.23; 204/159.24; 260/307 G; 548/301
[58] Field of Search .................. 204/159.23, 159.24, 204/159.19, 159.15, 159.16, 159.18; 96/115 P

[56] References Cited
U.S. PATENT DOCUMENTS

| 2,773,822 | 12/1976 | Kern ........................ 204/159.24 X |
| 3,615,633 | 10/1971 | Brooks ............................... 96/123 |
| 3,622,334 | 11/1971 | Hurley et al. ................. 96/115 P X |
| 3,962,055 | 6/1976 | Pacifici et al. ............. 204/159.23 X |

FOREIGN PATENT DOCUMENTS 1,094,755  12/1960  Germany

OTHER PUBLICATIONS

Turro, *Molecular Photochemistry,* W. A. Benjamin, Inc. New York (1965) pp. 132 & 133.

*Primary Examiner*—Howard E. Schain
*Assistant Examiner*—W. C. Danison, Jr.
*Attorney, Agent, or Firm*—Elliott Stern; Daniel B. Reece, III

[57] ABSTRACT

The invention relates to photopolymerizable polymeric compositions useful as coating and moldable compositions which are hardenable by ultraviolet radiation. These coating and moldable compositions comprise mixtures of photopolymerizable or photocrosslinkable unsaturated compounds and at least one photoinitiator selected from the group consisting of halogenated heterocyclic compounds having at least one diazole or triazole group and at least one benzyl halide group.

13 Claims, No Drawings

PHOTOPOLYMERIZABLE POLYMERIC COMPOSITIONS CONTAINING HALOGEN CONTAINING HETEROCYCLIC COMPOUND

This invention relates to photopolymerizable polymeric compisitions useful as coating and modlable compositions. More particularly, the invention relates to photopolymerizable compositions comprising photopolymerizable or photocrosslinkable unsaturated compounds and halogenated heterocyclic photoinitiators which compositions harden on exposure to ultraviolet radiation.

Heretofore it has been known to prepare coating compositions consisting of photopolymerizable ethylenically unsaturated materials. It is also known that the degree of polymerization and extent of crosslinking of these systems are dependent upon the intensity of the light. Under direct radiation, this conversion proceeds very slowly, principally because of the polymerizable compounds absorb only short wavelength light. Attempts have been made, therefore, to find substances which may be added to the polymerizable or crosslinkable compounds that are capable of accelerating the polymerization.

There are many substances which have been found which are capable of accelerating photopolymerization. Such accelerators include, for example, halogenated aliphatic, alicyclic, and aromatic hydrocarbons and their mixtures in which the halogen atoms are attached directly to the ring structure in the aromatic and alicyclic compounds; that is, the halogen is bonded directly to the aromatic hydrocarbon nucleus; the halogen atoms are attached to the carbon chain in the aliphatic compounds. The halogen may be chlorine, bromine, or iodine. These sensitizers or photoinitiators are used in amounts of about 0.1 to 25% by weight and preferably from 0.5 to 5% of the compound-photoinitiator mixture. Suitable photoinitiators previously used in the art include, for example, polychlorinated polyphenyl resins, such as polychlorinated diphenyls, polychlorinated triphenyls, and mixtures of polychlorinated diphenyls and polychlorinated triphenyls; chlorinated rubbers, such as the Parlons (Hercules Powder Company); copolymers of vinyl chloride and vinyl isobutyl ether, such as Vinoflex MP-400 (BASF Colors and Chemicals, Inc.); chlorinated aliphatic waxes, such as Chlorowax 70 (Diamond Alkali, Inc.); Perchloropentacyclodecane, such as Dechlorane+ (Hooker Chemical Co.); chlorinated paraffins, such as Clorafin 40 (Hooker Chemical Co.) and Unichlor-70B (Neville Chemical Co.); mono- and polychlorobenzenes; mono- and polybromobenzenes; mono- and polychloroxylenes; mono- and polybromoxylenes; dichloromaleic anhydride; 1-chloro-2-methyl naphthalene; 2,4-dimethylbenzene sulfonyl chloride; 1-bromo-3-(m-phenoxy benzene); 2-bromoethyl methyl ether; chlorendic anhydride; and the like; and mixtures thereof, and the like. While there are many photoinitiators known in the art to increase the speed of curability of hardenability of coating and moldable compositions, there is a need in the art for more efficient and effective photoinitiators. Therefore, to provide more effective and efficient photoinitiators would be an advance in the state of the art.

It is therefore, an object of the present invention to provide more effective and efficient ultraviolet photoinitiators.

Another object of the present invention is to provide useful coating and moldable compositions characterized by improved hardenability to ultraviolet radiation.

It is still another object of the present invention to provide compositions containing photoinitiators which provide ultraviolet curable and hardenable coatings and moldable articles such as films.

It is a still further object of this invention to provide compositions comprising ethylenically unsaturated polymerizable compositions and at least one photoinitiator capable of curing when exposed to actinic radiation and especially ultraviolet radiation.

It is a still further object of this invention to provide compositions containing photoinitiators capable of curing and hardening when exposed to actinic radiations, including short wave-length visible radiations.

Further objects and advantages of the invention will be apparent to those skilled in the art from the accompanying disclosure and claims.

In accordance with the present invention, polymeric compositions are provided composed of ethylenically unsaturated compounds and a photoinitiator having the following formula:

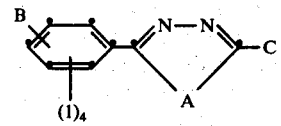

wherein A is an oxygen atom, a sulfur atom, or a nitrogen atom containing a hydrogen atom or a substituted or unsubstituted lower alkyl group having 1 to 12 carbon atoms;

B is a $-CH_2X$, $-CHX_2$ or $-CX_3$ group;

X is a halogen atom;

I is hydrogen, halogen, alkyl, alkoxy, aryl, arloxy, hydroxy, substituted amino, carbonylalkoxy or cyano; and C is alkyl, substituted alkyl, aryl or substituted aryl group.

The term alkyl means alkyl groups having preferably 1 to 18 carbon atoms. Alkoxy means alkoxy groups having 1 to 18 carbon atoms. Aryl means a phenyl or naphthyl group. Arylalkoxy means phenyl or naphthyl containing an alkoxy substituent having 1 to 10 carbon atoms; and the term substituted for aryl, alkyl or amino means substituted by any of the other substituents lised for I, and carbonylalkoxyl means an alkoxy as defined hereinbefore which also contains a carbonyl group.

The ethylenically unsaturated compounds useful in the present invention can be for example lower alkyl and substituted alkyl esters of acrylic and methacrylic acid. Examples of such esters include: methyl methacrylate, ethyl methacrylate, 2-ethylhexyl methacrylate, isobutyl methacrylate, butyl acrylate, 2-ethylhexyl acrylate, 2-hydroxyethyl acrylate, 2-methoxyethyl acrylate, 2-hydroxpropyl acrylate, and the like. Also useful are polyacrylyl compounds represented by the general formula:

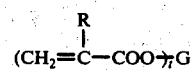

R is hydrogen or methyl; G is a polyvalent alkylene group of the formula

—$C_xH_{2x}$—Y—in which X is 2 to 10 and y is 0 to 2 (e.g. (a) divalent alkylene such as $C_xH_{2x}$ when y = o, i.e., —$C_2H_4$, —$C_3H_6$—, —$C_5H_{10}$—, neo-$C_5H_{10}$ and the like; (b) trivalent alkylene such as $C_xH_{2x}$-1 when y = 1, i.e.,

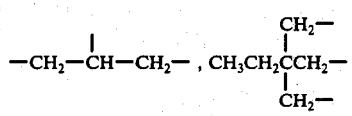

and the like, or (c) tetravalent alkylene such as $C_xH_{2x-2}$ when y = 2,

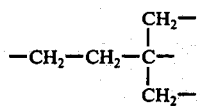

and the like); a divalent —$(C_rH_{2r}O)_tC_rH_{2r}$- group in which i t is 1 to 10 (e.g., oxyethylene, oxypropylene, oxybutylene, polyoxyethylene, polyoxypropylene, polyoxybutylene, polyoxyethylene-oxypropylene, -$CH_2C(CH_3)_2COOCH_2C(CH_3)_2CH_2$- etc.); and r is the valence of G and can be from 2 to 4. Also useful are allyl acrylates and methacrylates; e.g., allyl methacrylate, allyl acrylate, diallyl acrylate. Other unsaturated compounds useful in the invention are, vinyl acetate, vinyl and vinylidine halides; e.g., vinyl chloride, vinylidine chloride, amides; e.g., acrylamide, diacetone acrylamide, vinyl aromatics; e.g., styrene, alkyl styrenes, halostyrenes, and divinyl benzenes.

In addition, other unsaturated compounds which can be photopolymerized by using the initiators of this invention are unsaturated polyester resins which are known in the art. Such polyesters may be prepared by reaction of $\alpha,\beta$-unsaturated dicarboxylic acids can be replaced by saturated dicarboxylic acids or aromatic dicarboxylic acids, e.g., isophthalic acid and the like. Polyhydric alcohols are preferably dihydric alcohols such as ethylene glycol, however, trihydric and polyhydric alcohols such as trimethylolpropane can also be conjointly used. Examples of such $\alpha,\beta$-unsaturated dicarboxylic acids or their anhydride counterparts include maleic, fumaric, itaconic and citraconic and the like.

The above unsaturated compounds can be used alone or as mixtures of such compounds of mixtures in combination with other unsaturated components and the like.

The photoinitiators may be added at any time in the production of the photopolymerizable compositions in amounts conventionally used for photoinitiators. They are generally used in amounts of from 0.01 to 10%, preferably in amounts of from 0.5 to 3% by weight, based on the weight of the light-sensitive composition.

Conventional thermal inhibitors which are used in the production of light-sensitive compositions, for example hydroquinone, p-methoxy phenol, t-butyl hydroquinone may also be used in the conventional manner in the light-sensitive compositions of this invention to alter the curing rates and/or to provide longer storage stability.

The photopolymerizable compositions of the present invention may also contain other additives, pigments, colorants, stabilizers and the like. For example, polymeric compositions, such as unsaturated polyesters may also contain and generally do contain other additives such as white or colored pigments or colorants, antioxidants, plasticizers, flow aids, processing aids, polymeric modifiers and the like.

This invention will be further illustrated by the following examples although it will be understood that these examples are included merely for purposes of illustration and are not intended to limit the scope of the invention.

EXAMPLE 1

2,5-Bis(p-chloromethylphenyl)-1,3,4-oxadiazole, I, can be prepared by the following procedure:

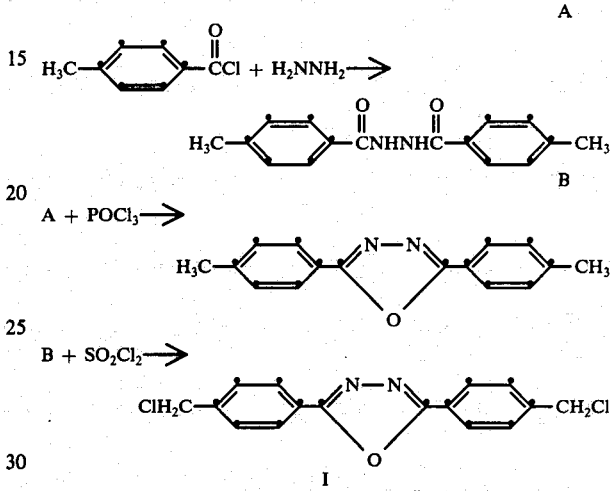

To a solution of hydrazine (0.05 mole) and sodium bicarbonate (0.1 mole) in 80 ml. of water, p-toluoyl chloride (0.1 mole) in 100 ml. of tetrahydrofuran (THF) was added slowly with stirring. After stirring for an additional 2 hr., the product A was filtered and washed with water (m.p. 258°14 260°, quantitative yield). A solution of A (0.022 mole) and 30 ml. of phosphorus oxychloride in 100 ml. of toluene was refluxed for 6 hr. The product B was filtered and recrystallized from ethanol (m.p. 170°–172°, yield 70%). A solution of B (0.01 mole), sulfuryl chloride (0.02 mole) and benzoyl peroxide (0.05 g.) in 100 ml. of chlorobenzene was gently refluxed for 2 hr. The solution was then cooled, washed with water, 5% sodium bicarbonate and water. After removal of solvent, product I was crystallized from ethanol (m.p. 180°–185°, yield 40%).

EXAMPLE 2

2,5-Bis-(p-chloromethylphenyl)-1,3,4-thiadiazole, II, can be prepared by the following procedure:

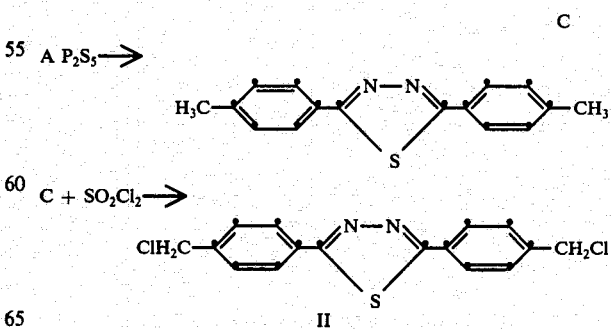

To a solution of A (0.037 mole) in 100 ml. of pyridine, phosphorus pentasulfide (0.05 mole) was added slowly.

When the spontaneous reaction subsided, the mixture was refluxed for 12 hr. The mixture was then cooled and added to a solution of 50 ml. ethanol and 750 ml. ice water. The product C was filtered and recrystallized from ethanol (m.p. 159°–162°, yield 85%). By following the same procedure as described for I, II was prepared (m.p. 175°–180°, yield 40%).

EXAMPLE 3

The compounds to be evaluated as photoinitiators were dissolved in the photocurable unsaturated compositions A, B, C (Table 1). The resultant compositions were coated as films onto glass plates and cured with a Gates 42OU11B mercury lamp (80 w/in.) for 1 min. The cured film was then peeled from the plate and extracted with dichloromethane for 2 hr. The percent extractable material indicated the degree of polymerization (insolubilization). The results shown in Table 1 indicate that the subject compounds are effective photoinitiators for a wide variety of unsaturated compounds. The chlorinated derivatives are effective, while the nonhalogenated analogues are ineffective.

Table 1

| Compound at 2% Concentration | % Dichloromethane Extractable in 2 Hr[a] | | | |
|---|---|---|---|---|
| | A (air) | B (air) | B (inert atm.) | C (air) |
| None | 75 | 100 | 100 | 68 |
| $CH_3$—⟨⟩—C(=N–N)—⟨⟩—$CH_3$ (O) | 94 | 100 | 100 | 38 |
| $ClCH_2$—⟨⟩—C(=N–N)—⟨⟩—$CH_2Cl$ (O) | 28 | 19 | 5 | 10 |
| $CH_3$—⟨⟩—C(=N–N)—⟨⟩—$CH_3$ (S) | 73 | 99 | 97 | 37 |
| $ClCH_2$—⟨⟩—C(=N–N)—⟨⟩—$CH_2Cl$ (S) | 13 | 12 | 4 | 18 |
| Biacetyl | 41 | — | — | — |
| Benzophenone | 65 | 100 | 100 | 53 |

Composition A = Unsaturated polyester of maleic anhydride and propylene glycol solution in styrene 80:20.
Composition B = 11.8% cellulose propionate crotonate
6.2% neopentyl glycol diacrylate
82.0% 2-methoxyethyl acrylate
Composition C = 52.8% 2-methoxyethyl acrylate
7.5% cellulose propionate crotonate
7.5% neopentyl glycol diacrylate
32.0% Ti-Pure R-100 $TiO_2$

[a] 1 min. with Gates 42OU11B mercury lamp, 80 w/in.

EXAMPLE 4

Polymerization constants were determined in 2-methoxy-ethyl acrylate for 2,5-bis(p-chloromethylphenyl)-1,3,4-oxadiazole and the thiadiazole by dilatometry by the method described by McGinniss and Insek, J. Paint Technology 46 No. 589, p 25 (1974). The results, shown in Table 2, indicate that the heterocyclic compounds are equally effective as photoinitiators and that they are vastly superior to the halogenated hydrocarbon, 9,10-bis(chloromethyl) anthracene.

Table 2

| Compound | Polymerization Constant, [a]M/l/sec |
|---|---|
| $ClCH_2$—⟨⟩—C(=N–N)—⟨⟩—$CH_2Cl$ (O) | $1.6 \times 10^{-4}$ |
| $ClCH_2$—⟨⟩—C(=N–N)—⟨⟩—$CH_2Cl$ (S) | $1.6 \times 10^{-4}$ |
| 9,10-bis(chloromethyl) anthracene | $8.8 \times 10^{-5}$ |

[a] For 2-methoxyethyl acrylate under nitrogen, by dilatometry.

These photopolymerizable compositions find particular utility as ultraviolet curable films and coatings. Such compositions include unsaturated polymeric compositions and a photoinitiator. Such unsaturated polymeric compositions are, for example, unsaturated polyester and polyurethane compositions, which can also contain minor amounts of poly-α-olefins, polyamides, acrylics, cellulose esters, rubbers both synthetic and natural and the like. Such compositions can be molded or shaped into articles or applied as coatings.

The invention has been described in detail with particular reference to preferred embodiments thereof, but it will be understood that variations and modifications can be effected within the spirit and scope of the invention.

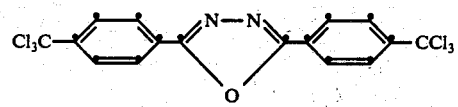

13. A composition of matter according to claim 3 wherein said photoinitiator has the formula:
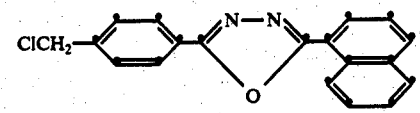

We claim:

1. A composition capable of forming coatings hardenable by ultraviolet radiation comprising a mixture of a photopolymerizable or photocrosslinkable ethylenically unsaturated compound and from 0.01 to 10% by weight of a photoinitiator selected from the group consisting of compounds having the formula

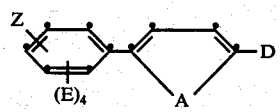

wherein A is an oxygen atom, a sulfur atom, or a nitrogen atom containing a hydrogen atom or a substituted or unsubstituted lower alkyl group having 1 to 12 carbon atoms;

Z is a —CH$_2$X, —CHX$_2$ or —CX$_3$ group;

X is a halogen atom;

E is hydrogen, halogen, alkyl, alkoxy, aryl, aryloxy, hydroxy, amino, carbonylalkoxy or cyano; and D is alkyl, substituted alkyl, aryl or substituted arly group.

2. A composition capable of forming coatings hardenable by ultaviolet radiation comprising a mixture of a photopolymerizable or photocrosslinkable ethylenically unsaturated compound and from 0.01 to 10% by weight of a photoinitiator selected from the group consisting of compounds having the formula

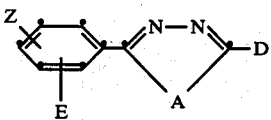

wherein A is an oxygen atom, a sulfur atom or a nitrogen atom containing a hydrogen atom or an alkyl group having 1 to 12 carbon atoms;

Z is —CH$_2$X, —CHX$_2$ or —CX$_3$;

X is halogen;

I is hydrogen; alkyl, alkoxy or phenyl; and

D is Z as defined above, phenyl, p-tolyl, naphthyl or

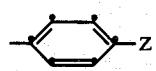

wherein Z is defined as above.

3. The composition of claim 2 wherein A is oxygen, E is hydrogen and Z is —CH$_2$Cl, —CHCl$_2$ or —CCl$_3$.

4. A composition according to claim 3 wherein said photoinitiator has the formula:

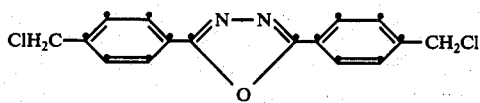

5. A composition of matter according to claim 2 wherein said photoinitiator has the formula:

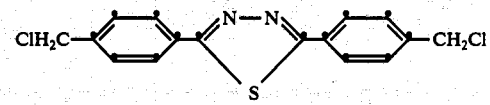

6. A composition of matter according to claim 3 wherein said photoinitiator has the formula:

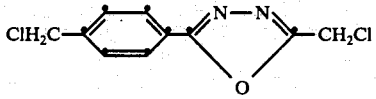

7. A composition of matter according to claim 3 wherein said photoinitiator has the formula:

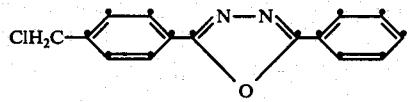

8. A composition of matter according to claim 3 wherein said photoinitiator has the formula:

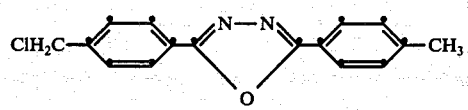

9. A composition of matter according to claim 2 wherein said photoinitiator has the formula:

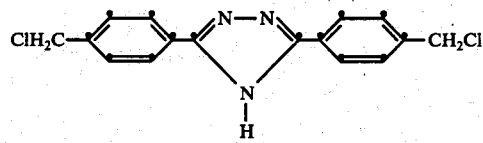

10. A composition of matter according to claim 2 wherein said photoinitiator has the formula:

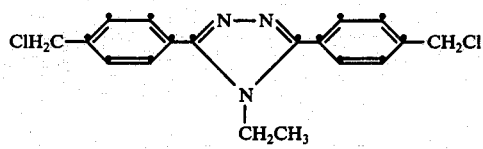

11. A composition of matter according to claim 3 wherein said photoinitiator has the formula:

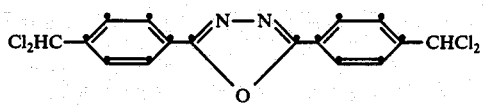

12. A composition of matter according to claim 3 wherein said photoinitiator has the formula: